United States Patent
Sun et al.

(10) Patent No.: US 10,749,481 B2
(45) Date of Patent: Aug. 18, 2020

(54) SUPPLY COMPENSATED DELAY CELL (71) Applicant: QUALCOMM Incorporated, San Diego, CA (US)

(72) Inventors: Bo Sun, Carlsbad, CA (US); Yi Tang, San Diego, CA (US); Daniel Butterfield, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/956,026

(22) Filed: Apr. 18, 2018

(65) Prior Publication Data
US 2019/0326862 A1 Oct. 24, 2019

(51) Int. Cl.
| | |
|---|---|
| H03F 3/68 | (2006.01) |
| H03F 1/56 | (2006.01) |
| H03F 1/02 | (2006.01) |
| H03F 3/21 | (2006.01) |
| H03F 1/30 | (2006.01) |

(52) U.S. Cl.
CPC .......... *H03F 1/56* (2013.01); *H03F 1/0261* (2013.01); *H03F 1/302* (2013.01); *H03F 3/211* (2013.01); *H03F 2200/387* (2013.01)

(58) Field of Classification Search
CPC ..... H03F 1/56; H03F 1/0261; H03F 2200/387
USPC ........................................ 330/144, 145, 284
See application file for complete search history.

(56) References Cited

U.S. PATENT DOCUMENTS

| | | | | |
|---|---|---|---|---|
| 6,941,122 B2 * | 9/2005 | Shim | .......................... | H03F 1/30 330/278 |
| 7,257,382 B2 * | 8/2007 | Arai | ..................... | H03G 1/0088 330/254 |
| 7,710,201 B2 * | 5/2010 | Kirisawa | .............. | H03G 3/3042 330/279 |
| 7,821,334 B2 * | 10/2010 | Maeda | ...................... | H03F 1/42 330/124 R |
| 8,131,232 B2 * | 3/2012 | Muhammad | ......... | H04B 1/0458 330/86 |
| 8,648,661 B1 * | 2/2014 | Dolin | ........................ | H03F 3/24 330/279 |
| 9,100,017 B2 | 8/2015 | Jaffari | | |
| 9,143,172 B2 * | 9/2015 | See | .......................... | H03F 1/565 |
| 9,197,176 B2 * | 11/2015 | Kousai | ..................... | H03F 1/56 |
| 10,075,025 B2 * | 9/2018 | Ichikawa | ................ | H02J 7/025 |

(Continued)

OTHER PUBLICATIONS

International Search Report and Written Opinion—PCT/US2019/022675—ISA/EPO—dated Jun. 4, 2019.

*Primary Examiner* — Khanh V Nguyen
(74) *Attorney, Agent, or Firm* — Qualcomm Incorporated (57) ABSTRACT

Aspects generally relate to reducing delay, or phase jitter, in high speed signals transmission. Variations in power supply to ground potential changes the amount of delay introduced by transmit circuitry into the signal being transmitted, resulting in jitter, or phase noise, in the transmitted signal. To reduce phase jitter, or phase noise, aspects disclosed include a variable impedance circuit coupled to the signal distribution network, the impedance level of the variable impedance circuit is adjusted in response to variation in the supply to ground potential, such that the delay introduced by the impedance compensates for changes in the delay due to variations in supply to ground potential, resulting in substantially constant delay.

26 Claims, 6 Drawing Sheets

(56) References Cited

U.S. PATENT DOCUMENTS

2014/0368249 A1* 12/2014 Lee ................... H03K 5/131
                                                327/262
2016/0373097 A1* 12/2016 Prasad ................ G06F 1/04

* cited by examiner

SUPPLY COMPENSATED DELAY CELL

BACKGROUND

I. Field of the Disclosure

Aspects of the disclosure relate generally to signal distribution networks, and in particular to reducing jitter, or phase noise, introduced by variations in supply to ground potential.

II. Background

System on a chip (SoC) are widely used in modern mobile electronics, such as cell phones. Mobile devices are powered by batteries so low power consumption is needed to extend the length of time a device can be operated between charges. In addition, modern electronic circuits implemented in SoC operate at high frequencies, up to 10-20 GHz. At these high frequencies, where a clock or data signal can have a period as short as 50 ps, any jitter or phase noise, even as small as 5 ps, introduced into a signal can have very negative impact on circuit operation.

Clock and data signals, as well as radio frequency (RF) transceiver circuits require very low-level jitter or phase noise. The jitter or phase noise can be caused by variations, or noise, on the voltage supply or ground of the circuit, causing a variation of the potential between the supply voltage and ground.

Figure 1:
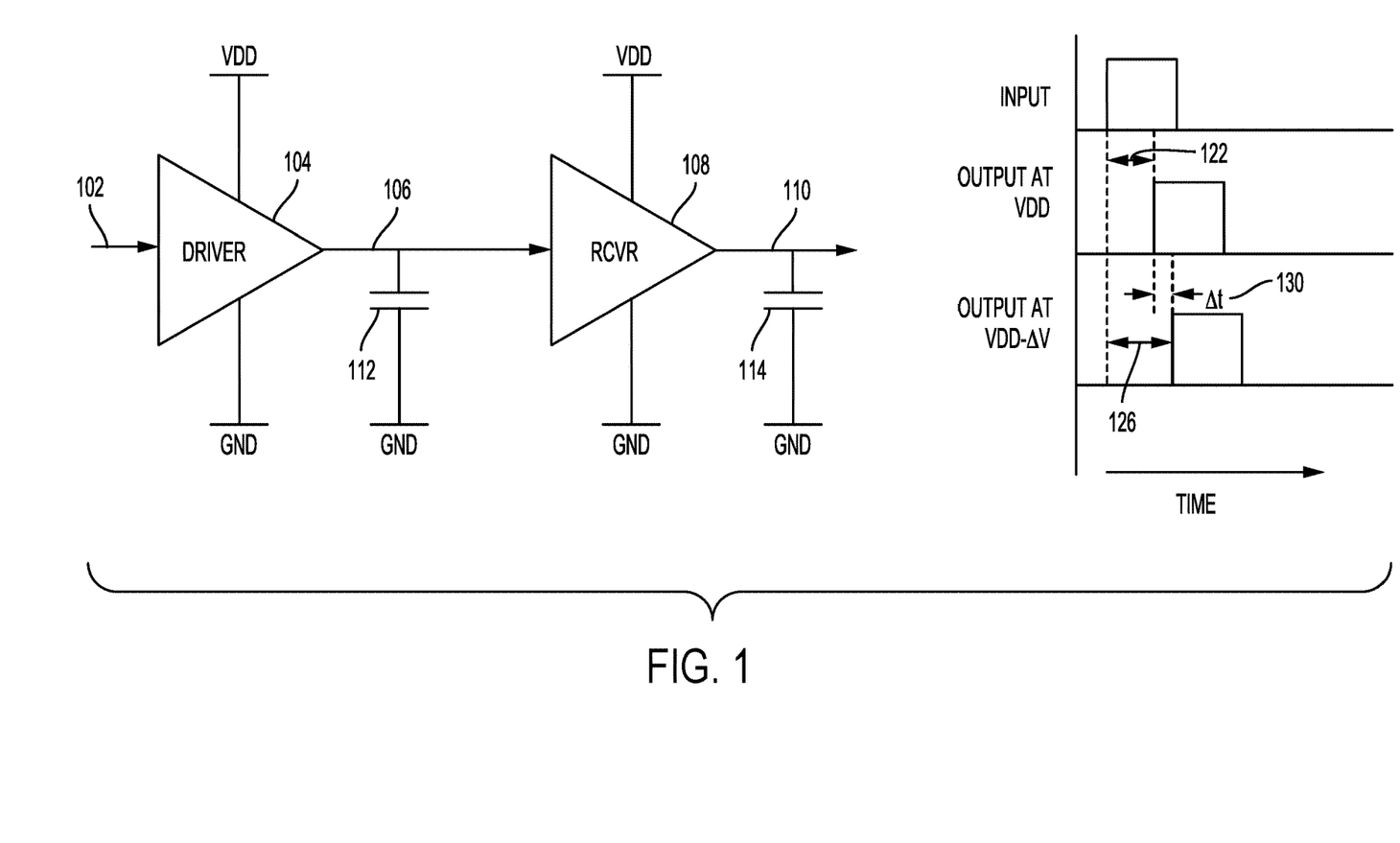
FIG. 1 is a diagram of a typical circuit that could be used to distribute a signal, such as a clock signal.

FIG. 1 is a diagram of a typical circuit that could be used to distribute a signal, such as a clock signal. In FIG. 1 an input signal 102, such as a clock signal, is input to a driver 104. The driver 104 is powered by a supply voltage VDD and ground GND. The output of the driver 104 is coupled to a distribution line 106 used to couple the output of the driver 104 to the input of a receiver circuit 108. The receiver circuit 108 is powered by the supply voltage VDD and ground GND. An output 110 of the receiver circuit 108 distributes the received signal to other circuitry. The distribution line 106 includes a first capacitor 112 coupled from the distribution line 106 to ground GND. The output 110 of the receiver circuit 108 includes a second capacitor 114 coupled from the output 110 to ground GND. The first and second capacitors 112 and 114, respectively, can be parasitic capacitors or physical capacitors.

Ideally, the output 110 of the receiver 108 is a duplicate of the input signal 102 with a constant delay, or constant phase shift, between the input signal 102 and output signal 110 as the signal travels through the driver and receiver circuit. However, variations in the potential between the supply voltage VDD and ground GND can introduce jitter or phase noise in the output signal 110. The transconductance of the driver circuit 102 and receiver circuit 108 are proportional to the potential between the supply voltage VDD and ground GND. Variations in the transconductance increase or decrease the delay of the output signal 110. As illustrated in FIG. 1, when VDD to ground GND potential is at a first level, VDD, the output signal 110 has a first delay 122. When the VDD to ground GND potential is at a second level, VDD-AV, that is lower than the first level, VDD, the output signal 110 has a second, longer, delay 126. As illustrated, when VDD to ground GND is a higher potential the output signal 110 has a first delay 122 that is less than the second delay 126, by Δt 130, when VDD to ground GND is a lower potential. Variations in VDD to ground GND potential can be caused by circuit operation. For example, in a MOSFET circuit as transistors switch ON and OFF they draw more or less current which can cause variations in the VDD to ground GND potential. In addition, there can be noise introduced in the ground GND by operation of other circuitry within the SoC.

There is a need for signal distribution circuits that reduce, or make constant, the jitter or phase noise due to variations in VDD to ground GND potential.

SUMMARY OF THE DISCLOSURE

The described aspects generally relate to reducing jitter, or phase noise, in high speed signal transmission. Variations in power supply to ground potential change the transconductance of circuitry used to transmit and receive signals. The change in transconductance changes the amount of delay introduced in the signal being transmitted through the circuitry, resulting in jitter or phase noise in the transmitted signal. To reduce jitter, or phase noise, aspects disclosed include an apparatus with a control circuit including a supply sense circuit configured to sense variations between a power supply to ground potential and to generate a control signal in response to the variation, The apparatus includes a variable impedance circuit coupled to the control circuit and a signal distribution network, the impedance level of the variable impedance circuit adjusted in response to the control signal. In one embodiment, the apparatus also includes a bias circuit configured to generate a potential that is combined with the control signal to set the control signal to a desired nominal operating range.

In an embodiment, the variable impedance circuit includes a variable capacitor. In another embodiment, the variable impedance includes a capacitor in series with a transistor. The transistor can be configured to operate as a switch or variable resistor. When the transistor is operating as a variable resistor its resistance can be varied to obtain a desired delay in response to variations in the supply to ground potential. In another embodiment, there can be a plurality of capacitor and transistor branches coupled to the distribution with the transistors configured as switches and a selective set of switches closed to produce a desired capacitive load on the transmitted or received signal.

Varying the impedance on a transmitted or received signal varies the loading, and delay, on the signal output from the transmit or receive circuitry. In this way changes in the amount of delay introduced by variations in the supply to ground potential can be compensated for with increase or reduction in the delay introduced by the impedance. The delay introduced from variations in supply to ground potential and the variable impedance can be in the opposite direction from each other to cancel each other to produce a substantially constant phase delay, or jitter, in the transmitted or received signal.

The apparatuses described can be used in high-speed signal distribution networks, such as Serialized/Deserialized (SerDes) data transmission networks. The apparatuses can also be used in clock distribution networks, RF transceiver circuits, local oscillator distribution circuits, or any other signal distribution network. The apparatuses can be used in both the driver side and receive side of a signal distribution network.

Also disclosed is a method of compensating for delays introduced in a signal distribution network by variations in supply to ground potential. The method includes sensing a variation between a supply to ground potential. Generating a control signal based at least in part on the variations. Adjusting a variable impedance coupled to the signal distribution network in response to the control signal.

Various aspects and features of the disclosure are described in further detail below.

BRIEF DESCRIPTION OF THE FIGURES

The accompanying drawings are presented to aid in the description and illustrations of embodiments and are not intended to be limitations thereof.

The drawings may not depict all components of a particular apparatus, structure, or method. Further, like reference numerals denote like features throughout the specification and figures.

DETAILED DESCRIPTION

Aspects disclosed in the following description and related drawings are directed to specific embodiments. Alternative embodiments may be devised without departing from the scope of the invention. Additionally, well-known elements may not be described in detail, or may be omitted, so as not to obscure relevant details. Embodiments disclosed may be suitably included in any electronic device.

With reference now to the drawing, several exemplary aspects of the present disclosure are described. The word "exemplary" is used herein to mean "serving as an example, instance, or illustration." Any aspect described herein as "exemplary" is not necessarily to be construed as preferred or advantageous over other aspects. Furthermore, the terminology used herein is for the purpose of describing particular embodiments and is not intended to be limiting A supply compensated delay cell can be used to reduce jitter or phase noise in a signal. The supply compensated delay cell can use active delay adjustment of impedance on the output of a driver or receiver circuit. For example, capacitive loading on the output of a driver circuit can be adjusted with higher effective capacitive loading causing a larger delay and lower effective capacitive loading reducing delay. The amount of effective capacitive loading being controlled to compensate for the delay introduced due to variation in the voltage supply to ground potential.

Figure 2A:
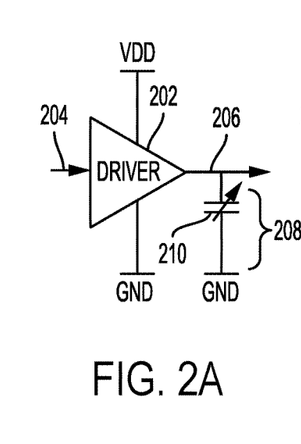
FIGS. 2A, 2B, 2C, 2D, and 2E are diagrams illustrating aspects of the operation of a variable impedance to compensate for variations in supply to ground variations.

FIGS. 2A, 2B, 2C, 2D, and 2E are diagrams illustrating aspects of the operation of a variable impedance to compensate for variations in supply to ground variations to produce a substantially constant phase delay or jitter. As shown in FIG. 2A, a driver 202 receives an input signal 204 and produces an output signal 206. Coupled between the output signal 206 and ground GND is a variable impedance 208 shown in the example of FIG. 2A as a variable capacitor, or varactor, 210 that can be controlled by a control signal (not shown). The driver 202 is power by a potential between a supply voltage VDD and ground GND. As discussed above if the potential between the supply voltage VDD and ground GND changes the transconductance of the driver changes. For example, if the potential between the supply voltage VDD and ground GND decreases then the transconductance of the driver 202 decreases causing an increase in the delay or phase jitter introduced by the driver 202 between the input signal 204 and output signal 206. To compensate for the increased delay introduced by the driver 202, the variable capacitor 210 value is decreased thereby decreasing the delay or phase jitter introduced by the capacitor 210 loading. Likewise, if potential between the supply voltage VDD and ground GND increases the transconductance of the driver 202 increases causing a reduction in the delay or phase jitter introduced by the driver 202 between the input signal 204 and output signal 206. To compensate for the decreased delay introduced by the driver 202 the variable capacitor 201 value is increased thereby increasing the delay or phase jitter introduced by the capacitor 210 loading. Increasing or decreasing the delay introduced by the variable impedance 208 loading compensates for the decrease or increase in the delay introduced by variations in the supply VDD to ground GND potential.

Figure 2B:
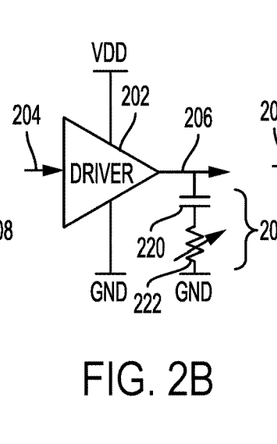

FIG. 2B is a circuit similar to FIG. 2A with the variable impedance 208 comprising a fixed capacitor 220 in series with a variable resistor 222, that can be controlled by a control signal (not shown), between the output signal 206 and ground GND. In the example circuit of FIG. 2B, as the potential between the supply voltage VDD and ground GND varies causing variations in the delay or phase jitter introduced by the driver 202, the variable impedance 208 varies by adjusting the variable resistance 222. If the delay or phase jitter introduced by the driver 202 decreases, the variable resistor 222 is controlled (controller not shown) to decrease the resistance value of the variable resistor 222 to increase the delay introduced by the variable impedance 208. Likewise, if the delay or phase jitter introduced by the driver 202 increases, then the variable resistor 222 is controlled (controller not shown) to increase the resistance value of the variable resistor 222 to decrease the delay introduced by the variable impedance 208 to reduce additional delay. By increasing or decreasing the delay introduced by the variable impedance 208 loading compensates for the decrease or increase in the delay introduced by variations in the supply VDD to ground GND potential.

Figure 2C:
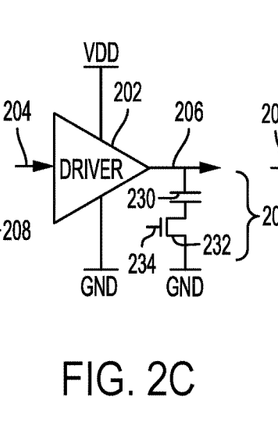

FIG. 2C is a circuit similar to FIG. 2A with the variable impedance 208 comprising a fixed capacitor 230 in series with a transistor 232. In one embodiment, the transistor 232 is configured as a variable resistor. In the example circuit of FIG. 2C, the transistor 232 is shown as an NMOS transistor, but other transistors can be used, such as a PMOS transistor, to operate as a variable resistor. In the example of FIG. 2C, a gate 234 of the NMOS transistor 232 is controlled by a control signal (not shown) to vary the resistance of the NMOS transistor similar to the operation described for FIG. 2B. In another embodiment, the transistor 232 is configured as a switch that can be controlled to switch the capacitor 230 in and out of the circuit. Again, by increasing or decreasing the delay introduced by the variable impedance 208 loading compensates for the decrease or increase in the delay introduced by variations in the supply VDD to ground GND potential.

Figure 2D:
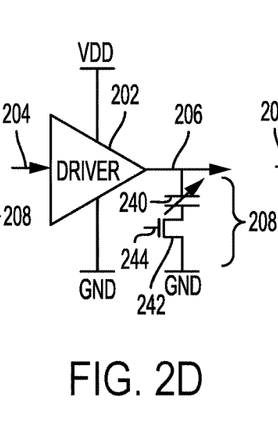

FIG. 2D is a circuit similar to FIG. 2A with the variable impedance 208 comprising a variable capacitance 240 in series with a transistor 242. In one embodiment, the transistor 242 is configured as a variable resistor, in another embodiment the transistor 242 is configured as a switch. Again, in the example circuit of FIG. 2D, the transistor 242 is shown as an NMOS transistor, but other transistors can be used, such as a PMOS transistor, to operate as a variable resistor. In the example of FIG. 2D, a gate 244 of the NMOS transistor 242 and the capacitance of the variable capacitor 240 are controlled by control signals (not shown). In the embodiment where the transistor 242 is configured as a variable resistor, the resistance of the transistor and the capacitance of the variable capacitor 240 are controlled to vary the delay introduced by the variable impedance 208 load. In the embodiment where the transistor 242 is configured as a switch, the transistor is turned on and off to switch the variable capacitor 240 in and out of the circuit.

Figure 2E:
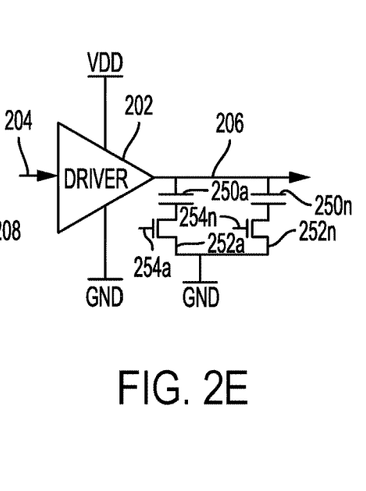

FIG. 2E is a circuit similar to FIG. 2A with the variable impedance 208 comprising one or more capacitor 250a/transistor 252a branches connected in parallel. The capacitor 250a to 250n values in each branch being the same or different and the transistors 252a to 252n are configured as switches. To vary the load, desired ones of the transistor switches 252a to 252n are opened and close, by control signals (not shown) to achieve the desired loading.

Figure 3:
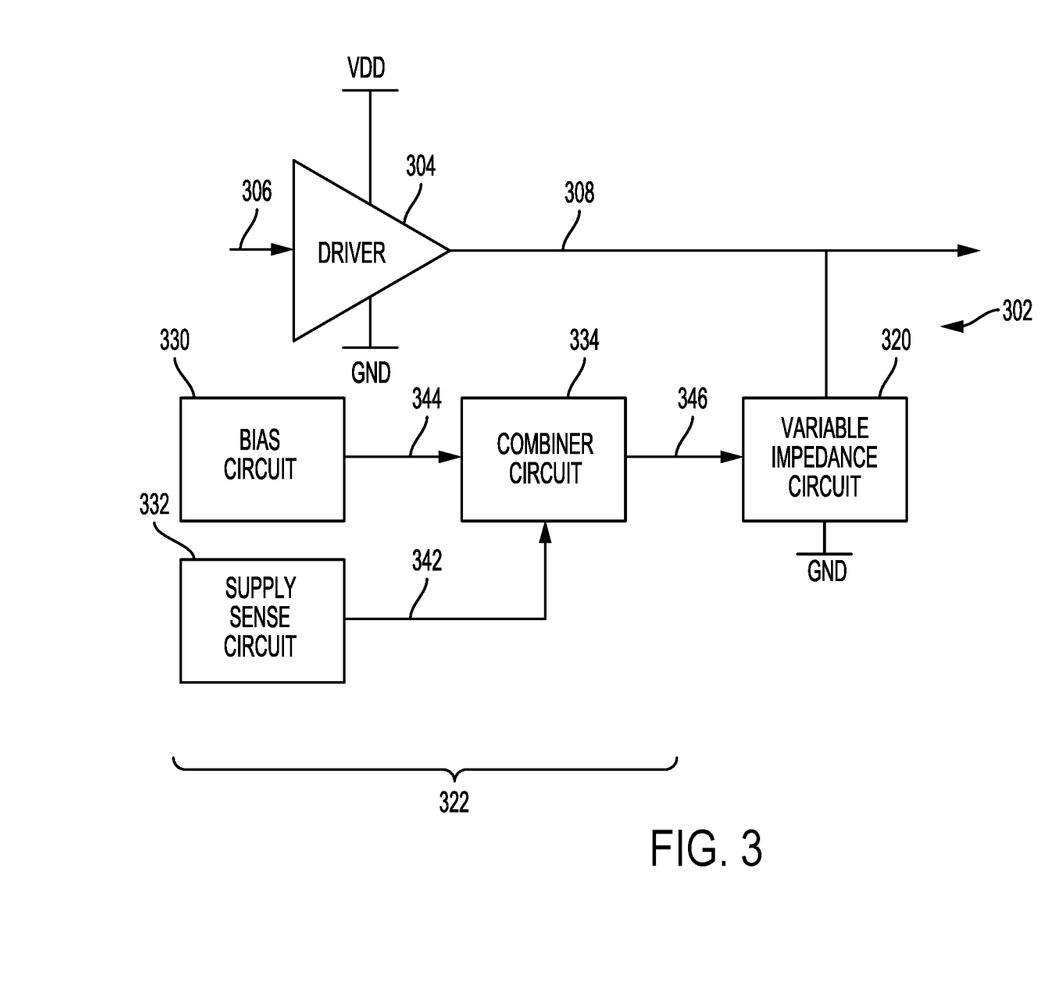
FIG. 3 is a diagram of an embodiment of a supply compensated delay cell.

As described in FIGS. 2A, 2B, 2C, 2D, and 2E, to keep the delay between an input signal and output signal substantially constant a variable impedance can be used to increase or decrease the loading on the output of a driver to increase or decrease the delay introduced by the loading. In other words, if the potential between the supply voltage VDD to ground GND increases, the transconductance of the driver increases causing the delay introduced by the driver 202 to decrease. To compensate for the decreased delay introduced by the driver 202 the loading on the output signal 206 can be increased to increase the delay introduced by the loading such that the overall delay remains substantially constant regardless of variations in potential between the supply voltage VDD and ground GND. Likewise, if the potential between the supply voltage VDD to ground GND decreases the transconductance of the driver decreases causing the delay introduced by the driver 202 to increase. To compensate for the increased delay introduced by the driver 202 the loading on the output signal 206 can be decreased to decrease the delay introduced by the capacitive loading such that the overall delay remains substantially constant regardless of variations in potential between the supply voltage VDD and ground GND FIG. 3 is a diagram of an embodiment of a supply compensated delay cell 302. In FIG. 3 there is a driver 304 operating off a supply voltage VDD and ground GND. The driver receives an input signal 306 and produces an output signal 308. The output signal 308 is a delayed replica of the input signal 306, however, as discussed above, variations in the supply VDD to ground GND potential can cause variations in the amount of delay or phase jitter in the output signal 308. To compensate for the variation in delay or phase jitter the supply compensated delay circuit 302 is coupled to the output signal 308.

The supply compensated delay cell 302 illustrated in FIG. 3 includes a variable impedance circuit 320 and a control circuit 322. In the example of FIG. 3 the control circuit 322 comprises a bias circuit 330, a supply sense circuit 332, and a combiner circuit 334. The circuits in the supply compensated delay cell operate on the supply voltage and ground but the connections are not shown, only the ground connection is illustrated for the variable impedance circuit 320 for clarity. The variable impedance circuit 320 can be, for example, configured similar to the variable impedance circuits 208 illustrated in FIGS. 2A-2E, or other variable impedance loads. The variable impedance circuit 320 is coupled to the output of the control circuit 322.

In the control circuit 322 the supply sense circuit 332 senses variations in the difference in potential between the supply voltage VDD and ground GND and outputs a signal 342 based on the variations. The bias circuit 330 can be used to set a nominal operating point of the variable impedance circuit 320. For example, the bias circuit 330 can output a signal 344 to set the operating point of the variable impedance circuit 320 to be at a desired impedance so that the impedance can be increased and decreased from the desired impedance to vary the impedance loading on the output signal 308. The combiner circuit 334 combines the supply sense circuit 332 output signal 342 and the bias circuit 330 output signal 344 and outputs a control signal 346 to adjust the variable impedance circuit 320 to a desired impedance.

In another embodiment of the supply compensated delay circuit the variable impedance circuit 320 may be at a desired impedance without the need for a bias circuit. In this embodiment, there would not be a bias circuit 330 or a combiner circuit 334 and the supply sense circuit 332 output signal 342 may be coupled to the variable impedance circuit 320.

In one embodiment, the combiner circuit 334 can output the control signal 346 that is an analog control signal that controls the variable impedance circuit 320. In another embodiment, the combiner circuit 334 can output the control signal 346 that is a digital control signal that controls the variable impedance circuit 320. In another embodiment, the combiner 334 can output the control signal 346 that includes both an analog and a digital control signal. For example, if the variable impedance circuit 320 is configured similar to the variable impedance 208 of FIG. 2A or 2B, the control signal can be an analog signal that adjusts the capacitance value of the variable capacitor 210 of FIG. 2A or the resistance of variable resistor 222 of FIG. 2B.

If the variable impedance circuit 320 is configured similar to the variable impedance 208 of FIG. 2C the control signal can be either analog or digital. In the embodiment where the transistor 232 is configured as a variable resistance the control signal can be analog to vary the resistance of the transistor 232. In the embodiment where the transistor is configured as a switch the control signal can be digital to turn on and off the transistor 232 to switch the capacitor 230 in and out of the circuit.

If the variable impedance circuit 320 is configured similar to the variable impedance 208 of FIG. 2D the control signal can be analog and digital. In the embodiment where the transistor 242 is configured as a variable resistor then one analog control signal can control the resistance of the transistor 230 and another to control the capacitance of the capacitor 240. In the embodiment where the transistor 242 is configured as a switch a digital control signal can turn the transistor 242 on and off and an analog control signal can be used to control the capacitance of the capacitor 240.

If the variable impedance 320 is configured similar to the variable impedance 208 of FIG. 2E the control signal can be a digital signal, or a plurality of digital signals to turn the transistors 254a-n in the one or more capacitor transistor branches on and off to get a desired capacitive load.

Figure 4:
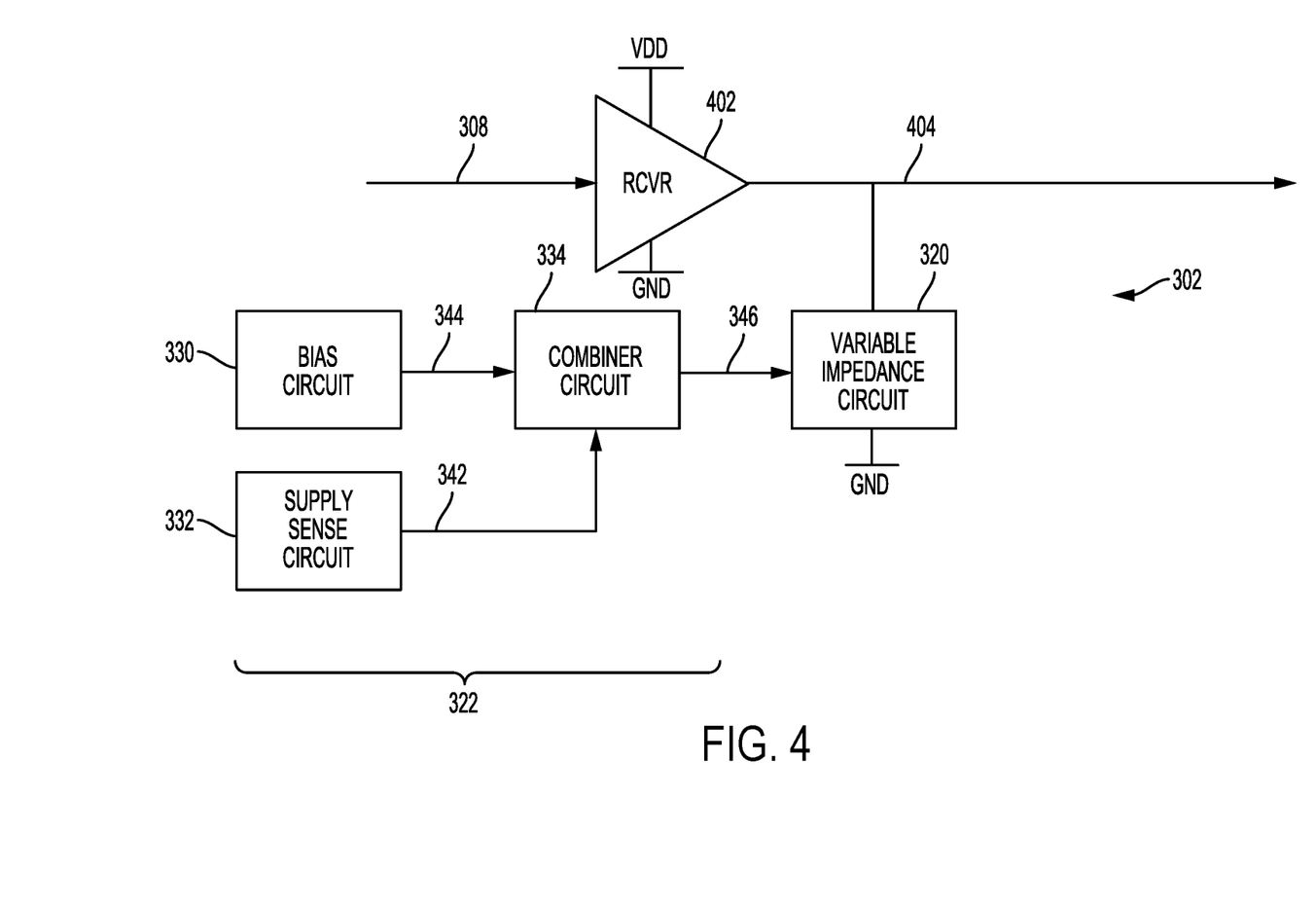
FIG. 4 is a diagram of another embodiment of a supply compensated delay cell 302 used at a receiver.

FIG. 4 is a diagram of another embodiment of a supply compensated delay cell 302 used at a receiver. In FIG. 4, the output signal 308 from the driver is coupled to a receiver 402 that produces a receiver output signal 404. The receiver 402 is powered by supply voltage VDD to ground GND potential. As discussed above variations in the potential between the supply voltage VDD and ground GND cause variations in the delay or phase jitter in the receiver output signal 404 due to variations in the transconductance of the receiver 402. The control circuit 322 and variable impedance circuit 320 operate in a manner as described in connection with FIG. 3.

Figure 5:
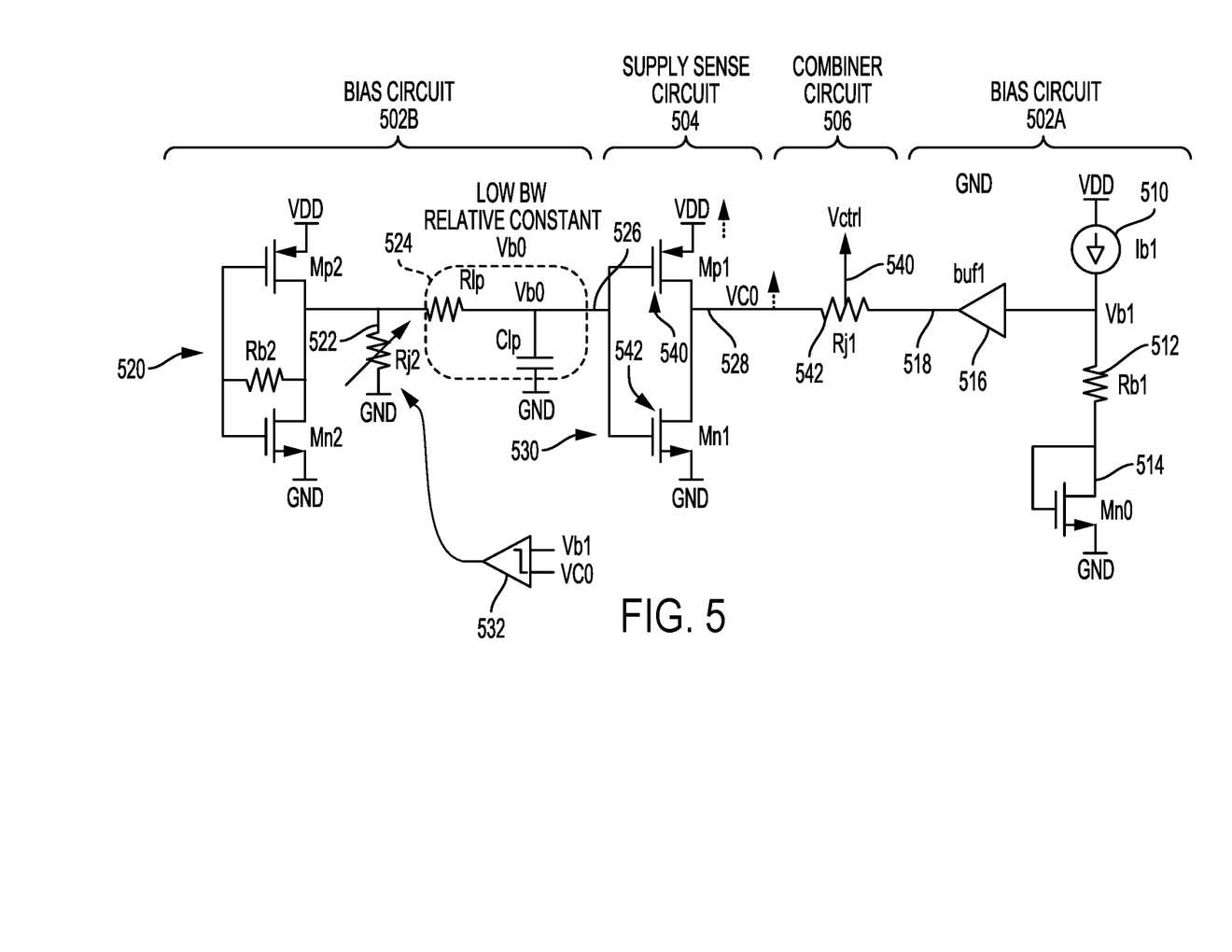
FIG. 5 is a diagram of an embodiment of a variable impedance control circuit.

FIG. 5 is a diagram of an embodiment of a variable impedance control circuit. As shown in the example of FIG. 5, the variable impedance control circuit includes two portions of a bias circuit 502A and 502B, a supply sense circuit 504 and a combiner circuit 506. In the example of FIG. 5, the first portion of the bias circuit 502A comprises a current source 510 a first resistor 512, a first NMOS transistor 514, and a buffer 516, The current source 510 provides a current that flows through the first resistor 512 and first NMOS transistor 514. The threshold voltage of the first NMOS transistor 514 and current through the first resistor 512 generate a voltage at the input of the buffer 516. The size of the first resistor 512 can be selected to generate a desired nominal voltage at the input to the buffer, such as a center of a desired operating range for a control range to control a variable impedance circuit. The buffer 516 produces a first portion of the bias circuit 502A output 518 that is equal to input voltage to the buffer 516.

The second portion of the bias circuit 502B comprises a DC bias circuit that generates a desired voltage level at the input to a low pass filter circuit 524. A first variable resistor 522 coupled from the input to the low pass filter 524 to ground can be adjusted such that the second portion of the bias circuit 502B output 528 is close to the same value as the output 518 of the first portion of the bias circuit 502A. The first variable resistor 522 can be controlled by a comparator circuit 532 that senses the difference between the supply sense circuit 504 output 518 and the bias circuit 502 output 528 to adjust the resistance of the variable resistor 522 to the desired value.

Components in the low pass filter 524 are selected so that the low pass filter 524 output 526 remains relatively constant relative to high frequency changes on the supply voltage VDD. The low pass filter 524 output 526 is input to a supply sense circuit 530. The second portion of the bias circuit 502B sets the nominal output level of the supply sense circuit 504. The transistors 540 and 542 in the supply sense circuit 504 operate on the supply voltage VDD and ground GND. Variations in the supply voltage VDD to ground GND potential cause variations in the output level 528 of the supply sense circuit 504.

The combiner circuit 506 receives the supply sense circuit 504 output 528 and the bias circuit 502A output 518 and outputs a control signal 540. In the example of FIG. 5 the combiner circuit 506 comprises a control variable resistor 542. A tap of the control variable resistor 542 can be adjusted to set a relative gain from the supply sense circuit 504 output 528 and the bias circuit 502A output 518.

In operation, if there are high frequency variation between the supply voltage VDD and ground GND the supply sense circuit 504 output 528 will vary in response. The bias circuit 502A output 518 will not respond to the high frequency variations between the supply voltage VDD and ground GND. The combiner circuit 506 output 540 will produce a voltage that can be used to control the value of a variable impedance circuit, such as the variable impedances in the examples of FIGS. 2A-E. As noted, the combiner circuit 506 output 540 can be used as an analog control to control the variable impedance, or there could be additional circuitry to condition the control signal. In addition, the combiner circuit 506 can include circuitry to convert the analog control signal to one or more digital signals used to control transistors configured as switches, such as described in connection with FIGS. 2A-2E.

Figure 6:
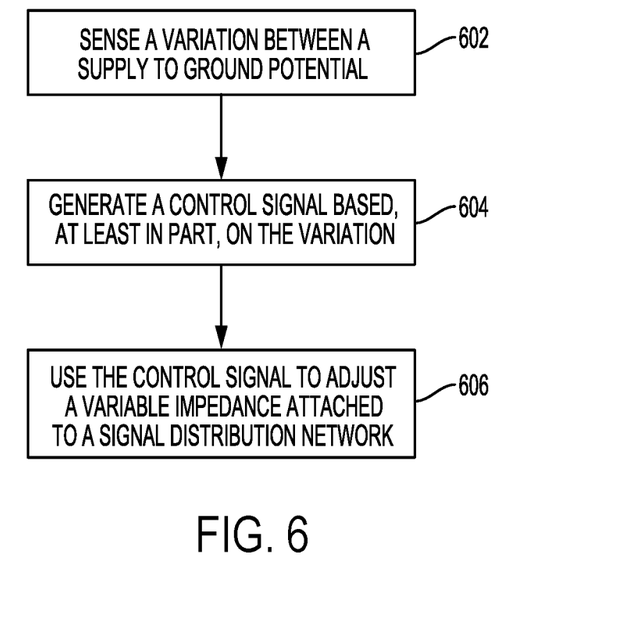
FIG. 6 is a flow chart illustrating aspects of a supply compensated delay cell.

FIG. 6 is a flow chart illustrating aspects of a supply compensated delay cell. Flow begins in block 602 where a variation between a power supply to ground potential of circuitry in a signal distribution network is sensed. Flow continues to block 604 where a control signal is generated based, at least in part, on the variation in the supply to ground variation. Flow continues to block 606 where a variable impedance attached to the signal distribution network is adjusted based on the control signal.

The supply compensated delay cell can be used in many different applications. For example, the supply compensated delay cell can be used in a high data rate serial link, such as a high speed Serializer/Deserializer (SerDes) high speed communication network. The supply compensated delay cell can also be used in RF applications, for example, cellular and millimeter wave transceiver circuits with local oscillator distribution networks. The supply compensated delay cell can be used in high speed clock distribution networks. The supply compensated delay network can be used in any delay/buffer circuit with poor supply noise rejection.

A supply compensated delay circuit may be included in many types of devices. For example, a hand-held personal communication system (PCS) unit, a portable data unit such as a personal digital assistant (PDA), a GPS enabled device, a navigation device, a set top box, a laptop, a tablet, a desktop computer, a data center server, a music player, a video player, an entertainment unit, a fixed location data unit such as a meter reading equipment, or a communications device, including an RF front end module, or combinations thereof. The disclosure is not limited to these exemplary illustrated units.

The various illustrative logical blocks, modules, and circuits described in connection with the aspects disclosed herein may be implemented or performed in an integrated circuit (IC), a system on a chip (SoC), an Application Specific Integrated Circuit (ASIC), a Field Programmable Gate Array (FPGA) or other programmable logic device, discrete gate or transistor logic, discrete hardware components, or any combination thereof designed to perform the functions described herein.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An apparatus comprising:
 a control circuit comprising a supply sense circuit configured to sense variations between a power supply to ground and output a supply sense circuit signal, and a bias circuit configured to generate a potential that is relatively constant relative to high frequency changes between the power supply to ground, the potential is combined with the supply sense circuit signal to set a control signal to an operation point;
 a variable impedance circuit coupled to the control circuit and a driver, the impedance level of the variable impedance circuit adjusted in response to the control signal.

2. The apparatus of claim 1, wherein the variable impedance circuit comprises a variable capacitor.

3. The apparatus of claim 1, wherein the variable impedance circuit comprises a capacitor in series with a transistor.

4. The apparatus of claim 3, wherein the transistor is configured as a switch, and is switched on and off in response to the control signal.

5. The apparatus of claim 3, wherein the transistor is configured as a variable resistor, and the resistance is varied in response to the control signal.

6. The apparatus of claim 1, wherein the variable impedance circuit comprises a plurality of capacitor transistor branches connected in parallel.

7. The apparatus of claim 6, wherein the transistors are configured as switches and selected ones of the transistors are switched on to obtain a desired impedance.

8. The apparatus of claim 1, wherein a driver output signal comprises a Serialized/Deserialized (SerDes) data signal.

9. The apparatus of claim 1, wherein a driver output signal comprises a clock signal.

10. The apparatus of claim 1, wherein a driver input signal comprises a Serialized/Deserialized (SerDes) data signal.

11. The apparatus of claim 1, wherein a driver input signal comprises a clock signal.

12. An apparatus comprising:
 a driver coupled to a power supply and ground, the driver configured to receive an input signal and output an output signal;
 a supply compensated delay circuit comprising:
 a control circuit comprising a supply sense circuit configured to sense variations between a power supply to ground and output a supply sense circuit signal, and a bias circuit configured to generate a potential that is relatively constant relative to high frequency changes between the power supply to ground, the potential is combined with the supply sense circuit signal to set a control signal to an operation point;
 a variable impedance circuit coupled to the driver, the impedance of the variable impedance circuit varied in response to the supply sense circuit signal.

13. The apparatus of claim 12, wherein the variable impedance circuit comprises a variable capacitor.

14. The apparatus of claim 12, wherein the variable impedance circuit comprises a capacitor in series with a transistor.

15. The apparatus of claim 14, wherein the transistor is controlled in response to the control signal to produce a variable resistance.

16. The apparatus of claim 12, wherein the control circuit further comprises a bias circuit and a combiner circuit.

17. The apparatus of claim 16, wherein the bias circuit outputs a signal and the combiner circuit combines the bias circuit output and the supply sense circuit signal and outputs the control signal.

18. The apparatus of claim 17, wherein the bias circuit output sets an operating point of the variable impedance circuit.

19. The apparatus of claim 12, wherein the input signal is a clock signal.

20. The apparatus of claim 12, wherein the input signal is a Serialized/Deserialized (SerDes) data signal.

21. The apparatus of claim 12, wherein the driver is configured as a receiver.

22. A method of compensating for delays in a driver circuit by variations in a power supply to ground, the method comprising:
 sensing variations between the power supply to ground and generating a sense signal;
 generating a control signal based at least in part on the sense signal;
 generating a potential that is combined with the sense signal to set the control signal to an operation point, the potential is relatively constant relative to high frequency changes between the power supply to ground; and
 adjusting a variable impedance coupled to the driver in response to the control signal.

23. An apparatus comprising:
 means for sensing variations between a supply to ground potential and generating a sense signal;
 means for generating a control signal based at least in part on the sense signal;
 means for generating a potential that is combined with the sense signal to set the control signal to an operation point, the potential is relatively constant relative to high frequency changes between the power supply to ground; and
 means for adjusting a variable impedance coupled to the driver in response to the control signal.

24. An apparatus comprising:
 a control circuit comprising a supply sense circuit configured to sense variations between a power supply to ground and output a supply sense circuit signal, and a bias circuit configured to generate a potential that is relatively constant relative to high frequency changes between the power supply to ground, the potential is combined with the supply sense circuit signal to set a control signal to an operation point;
 a driver with an output, the output coupled to a fixed capacitor in series with a variable resistor to ground, the variable resistor adjusted in response to the control signal.

25. The apparatus of claim 24, wherein the output comprises a Serialized/Deserialized (SerDes) data signal.

26. The apparatus of claim 24, wherein the output comprises a clock signal.

* * * * *